US012772897B2

(12) United States Patent
Patel et al.

(10) Patent No.: US 12,772,897 B2
(45) Date of Patent: Oct. 20, 2026

(54) ZERO-STRESS ZONES AND CONTROLLED-FRACTURING ZONES IN THE PASSIVATION LAYER OF A SEMICONDUCTOR DEVICE

(71) Applicant: NEXPERIA B.V., Nijmegen (NL)

(72) Inventors: Hamza Hanif Patel, Manchester (GB); Nivasan Yogeswaran, Manchester (GB); Mark Andrzej Gajda, Manchester (GB)

(73) Assignee: Nexperia B.V., Nijmegen (NL)

( * ) Notice: Subject to any disclaimer, the term of this patent is extended or adjusted under 35 U.S.C. 154(b) by 377 days.

(21) Appl. No.: 18/620,147

(22) Filed: Mar. 28, 2024

(65) Prior Publication Data

US 2024/0332107 A1 Oct. 3, 2024

(30) Foreign Application Priority Data

Mar. 29, 2023 (EP) .................................... 23164898

(51) Int. Cl.

| | |
|---|---|
| ***H10W 74/10*** | (2026.01) |
| ***H10W 74/01*** | (2026.01) |
| *H10D 30/63* | (2025.01) |

(52) U.S. Cl.

CPC ......... *H10W 74/131* (2026.01); *H10W 74/01* (2026.01); *H10D 30/63* (2025.01)

(58) Field of Classification Search

CPC ............................ H10W 74/131; H10W 74/01

See application file for complete search history.

(56) References Cited

U.S. PATENT DOCUMENTS

| | | | | |
|---|---|---|---|---|
| 10,475,896 B2 * | 11/2019 | Gao | ..................... | H10D 12/031 |
| 2018/0047652 A1 * | 2/2018 | Papadopoulos | ........ | H10D 12/00 |

* cited by examiner

*Primary Examiner* — Dale E Page
*Assistant Examiner* — Wilner Jean Baptiste
(74) *Attorney, Agent, or Firm* — Ruggiero Mcallister & McMahon LLC

(57) ABSTRACT

A method of manufacturing a semiconductor device, such as a power MOSFET, including: forming a metal layer, the metal layer including an edge where the metal layer ends; forming a passivation layer at a layer higher than the metal layer; and forming a passivation slot in the passivation layer, the passivation slot is at least partially positioned over the metal layer, and the passivation slot divides the passivation layer into multiple regions, each region experiences a reduced tensile stress $\sigma_{SiNx}$ as a result of the passivation slot.

18 Claims, 12 Drawing Sheets

400

400

500

ZERO-STRESS ZONES AND CONTROLLED-FRACTURING ZONES IN THE PASSIVATION LAYER OF A SEMICONDUCTOR DEVICE

CROSS-REFERENCE TO RELATED APPLICATIONS

This application claims the benefit under 35 U.S.C. § 119(a) of European Patent Application No. 23164898.1 filed Mar. 29, 2023, the contents of which are incorporated by reference herein in their entirety.

BACKGROUND

1. Field of the Disclosure

The present disclosure relates to a method of manufacturing a semiconductor device and a semiconductor device manufactured using said method. More specifically, the present disclosure relates to thermomechanical stress reduction in a passivation layer of the semiconductor device.

2. Description of the Related Art

Semiconductor devices, and in particular power devices, can be encapsulated with an epoxy moulding compound (EMC) during the assembly process at elevated temperatures of around 180° C. The EMC is moulded onto the device passivation, power metal, bond wires or clips, silicon substrate and package leadframe. The materials making up the final ensemble are known to have various coefficients of thermal expansion (CTEs), sometimes differing by as much as an order of magnitude. For most commonly used EMCs, the CTE is in the range 10-20 ppm/° C., which makes the EMC one of the dominant materials causing thermomechanical stress in the passivation layer of the MOSFET.

A schematic cross-section of an example power MOSFET is illustrated in FIG. 1. The following materials are shown having the following corresponding CTEs: Cu Leadframe 102 with $CTE_{CU}$=17 ppm/° C.; Si epitaxy 104 with $CTE_{Si}$=2.6 ppm/° C.; AlCu metal 106 with $CTE_{AlCu}$=23 ppm/° C.; $SiO_2$ oxide 108 with $CTE_{SiO2}$=0.55 ppm/° C.; $SiN_X$ passivation 110 with $CTE_{SiNx}$=2.5 ppm/° C.; and EMC 112 with $CTE_{EMC}$=12 ppm/° C. Also shown are trenches 114, forming, e.g., gate trenches. The movement of each of the materials due to thermal expansion is depicted by the arrows, where the length of the arrows indicates the amount of relative movement.

From FIG. 1 it is clear that upon cooling from the mould-cure temperature, the EMC will contract more than the materials making up the passivation layers (e.g., $SiO_2$ or $Si_3N_4$). In an unconstrained situation where the materials are not bonded to each other, this would not be a problem, but since the EMC is bonded to the passivation layer, shear stresses develop at the passivation/EMC interface that accumulate with every thermal cycle.

The results of an example simulation of the stress state in the passivation film as a result of temperature cycling to −55° C. is shown in FIG. 2. In FIG. 2, a 3-dimensional view of one quarter of a die 200 is shown, with a die corner 202 and the die middle 204 indicated in two corners of the quarter. Stress levels 206 are visualized, which increase from the middle 204 to the corner 202 as depicted by the contours 206. The following observations are made: (i) there exists a point near the middle 204 of the die 200 where the shear stress is close to zero; (ii) the direction of the principal shear stress, to, is towards the centre 204 of the die; (iii) the largest shear stress is concentrated in device corners 202; and (iv) device edges experience a varying degree of stress that decreases away from device corners 202.

The stress levels can cause cracks in the passivation layer. It has been found that the worst cracks are found near metal edges and particularly in device corners. The orientation of the cracks and tears is typically towards device middle at right angles to the principal force. A problem with passivation cracking is their uncontrolled nature, unpredictable propagation direction and extent, large temporal variability and poor correlation with device lifetime. The mechanism by which passivation cracks are initiated is known as 'plastic deformation by ratcheting'.

SUMMARY

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

The present disclosure aims to overcome the drawbacks identified in the background section. In particular, the present disclosure aims to present a solution to limit cracks forming in the passivation layer of a semiconductor device due to, e.g., thermomechanical stress or plastic deformation by ratcheting.

According to an aspect of the present disclosure, a method of manufacturing a semiconductor device is proposed. The method may include forming a metal layer. The metal layer may include an edge where the metal layer ends. The method may further include forming a passivation layer that at least partly covers the metal layer. The method may further include forming a passivation slot in the passivation layer. The passivation slot may be at least partially positioned over the metal layer. The passivation slot may divide the passivation layer in multiple regions. Each region experiences a reduced tensile stress $\sigma_{SiNx}$ as a result of the passivation slot. There may be one or more passivation slots.

In an embodiment, the passivation slot may be positioned over the metal layer to form a first region in the passivation layer and a second region in the passivation layer. In this embodiment, the first region does not have an anchor point with the edge of the metal layer and the second region has an anchor point with the edge of the metal layer.

In an embodiment, the second region may have an average width, $L_B$, measured from the passivation slot to the anchor point. The anchor point may be located at a distance $L_0$ from a middle of a die. $L_B$ may be in the range of $L_0/10$ to $L_0/10000$.

In an embodiment, the passivation slot may be positioned over the edge of the metal layer to form a first region in the passivation layer and a second region in the passivation layer. In this embodiment, none of the first region and the second region has an anchor point with the edge of the metal layer.

In an embodiment, one edge of the passivation slot may be placed over the metal layer while the other edge of the passivation slot may be placed off the metal but still atop a barrier foot.

In an embodiment, the passivation slot may be formed as a continuous passivation slot.

In an embodiment, the passivation slot may be polygonal shaped.

In an embodiment, the passivation slot may be formed as a serpentine passivation slot.

In an embodiment, the passivation slot may be formed as a honeycomb passivation slot.

In an embodiment, the passivation slot may be formed as a criss-cross passivation slot.

In an embodiment, the passivation slot may be formed as a zigzag passivation slot.

In an embodiment, the passivation slot may be formed as a non-continuous passivation slot.

In an embodiment, the passivation slot may be formed as a series of perforations.

In an embodiment, the passivation slot may follow one or more edges of the metal layer.

In an embodiment, the method may further include creating a controlled-fracturing zone in passivation layer. The controlled-fracturing zone may be a portion of the passivation layer where no passivation slot is formed. The controlled-fracturing zone may enable a concentration of tensile stress in the controlled-fracturing zone. Thus, the forming of cracks may be controlled and limited to the controlled-fracturing zone. There may be one or more controlled-fracturing zones.

In an embodiment, the controlled-fracturing zone may be formed between passivation slots.

According to an aspect of the present disclosure, a semiconductor device is proposed that has been manufactured using a method having one or more of the above-described features.

In an embodiment, the semiconductor device may be a power MOSFET.

BRIEF DESCRIPTION OF THE DRAWINGS

Embodiments of the present disclosure will now be described, by way of example only, with reference to the accompanying schematic drawings in which corresponding reference symbol indicate corresponding parts, in which.

Figure 1:
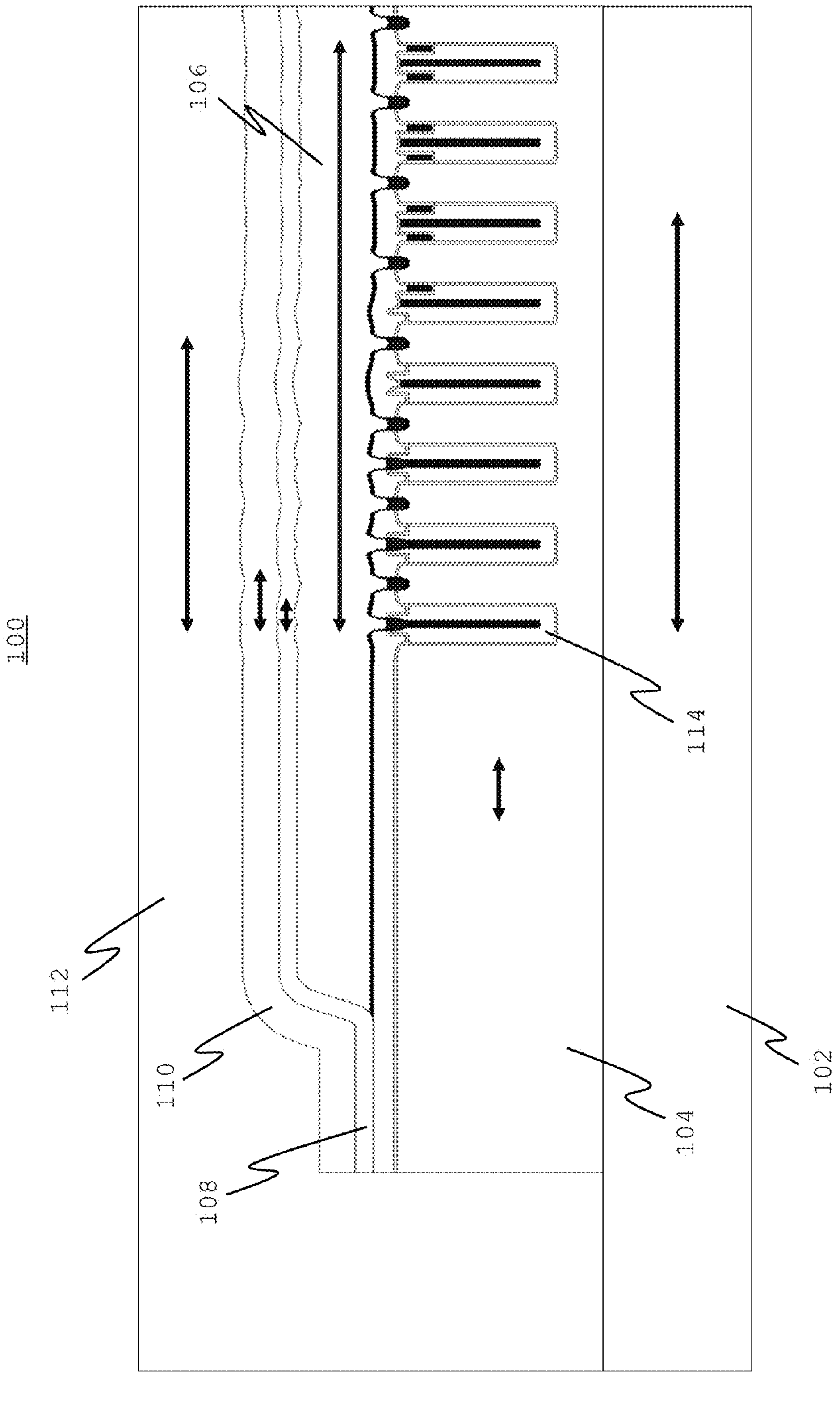
FIG. 1 shows a schematic cross-section of a power MOSFET.

The figures are intended for illustrative purposes only, and do not serve as restriction of the scope of the protection as laid down by the claims.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the present disclosure is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present disclosure should be or are in any single example of the present disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same example.

Furthermore, the described features, advantages, and characteristics of the present disclosure may be combined in any suitable manner in one or more embodiments. One skilled in the relevant art will recognize, in light of the description herein, that the present disclosure can be practiced without one or more of the specific features or advantages of a particular embodiment. In other instances, additional features and advantages may be recognized in certain embodiments that may not be present in all embodiments of the present disclosure. Reference throughout this specification to "one embodiment," "an embodiment," or similar language means that a particular feature, structure, or characteristic described in connection with the indicated embodiment is included in at least one embodiment of the present disclosure. Thus, the phrases "in one embodiment," "in an embodiment," and similar language throughout this specification may, but do not necessarily, all refer to the same embodiment.

In the following examples, layers of a semiconductor device may be identified as being formed by specific materials, such as a $SiN_x$ passivation layer, a Cu metal layer or an AlCu metal layer. It is to be understood that the present disclosure is not limited to these materials and that any other suitable material may be used for each of the layers. The proposed solution is applicable to various passivation materials, including polymeric layers. However, for simplicity the technique is illustrated in the following embodiments by using a $SiN_x$ passivation.

Stress levels in the passivation layer that can lead to cracks are typically caused by the ratcheting mechanism, which will be explained with the example of FIG. 3.

Figure 3:
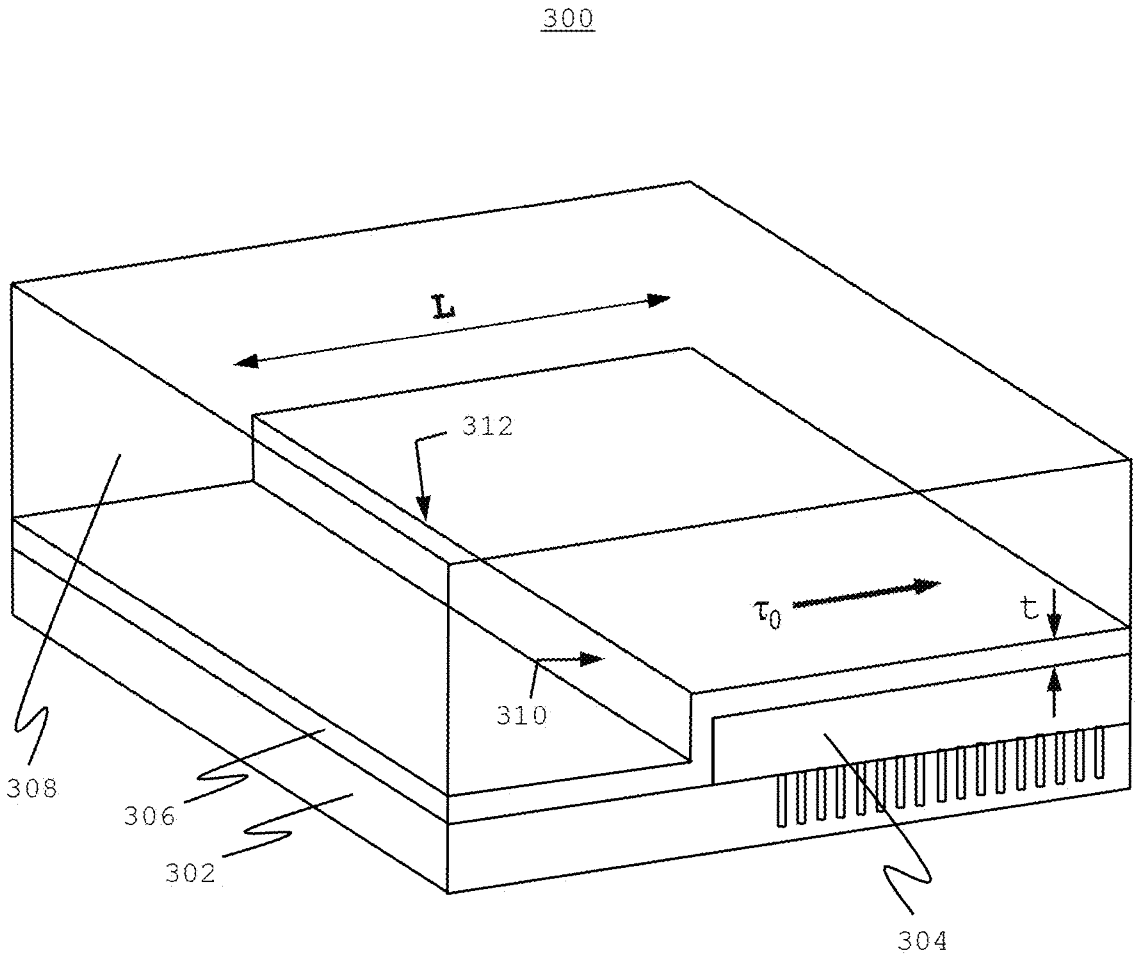
FIG. 3 shows a 3-dimensional schematic cross-section of a part of an example power MOSFET.

FIG. 3 shows a schematic cross-section of a part of an example power MOSFET 300, oriented with a die edge towards the left and the die middle towards the right. For explanatory purposes, the middle is presented here to be on the right side, making movements towards and from the middle linear from left to right. In reality, the middle will be at a center of the die, resulting in concentric forces and movements. A silicon layer 302, a metal layer 304, a $SiN_x$ passivation layer 306 and EMC 308 are shown. The metal layer 304 may form a source metal, a gate metal or any other metal layer.

Initially, all layers in the device are bonded to each other and there are no cracks in the passivation film. As temperature is cycled, e.g., between −55° C. and +150° C., the materials begin to contract and expand at rates determined by their CTEs. As a result, shear (or friction) stresses develop at material interfaces and initially the materials simply 'carry' each other towards device middle, ratcheting the stress with every thermal cycle. This carrying of each other would continue indefinitely were it not for the fact that in real devices the metal typically has an edge 310, which acts as an anchor for the overlaying passivation. The presence of the metal edge 310 is a stress raiser and a key factor in causing passivation-layer fatigue, which ultimately leads to crack initiation followed by a release of tensile energy in the form of uncontrolled crack growth.

An anchor point 312 may be defined as a point where the passivation layer wraps around the metal edge 310. The anchor point is not necessarily a single point but may follow the edge 310 of the metal layer. The anchor point 312 is relatively immobile and causes tensile stress $\sigma_{SiNx}$ to build up in the passivation layer near the edge 310 of the metal according to parameters described by equation 1:

$$\sigma_{SiN} = \sigma_D + \frac{\tau_0 L}{t} \qquad \text{(equation 1)}$$

In equation 1, $\sigma_D$ is the built-in stress of deposition (a property of the passivation deposition process), $\tau_0$ is the interfacial shear stress between the EMC and $SiN_x$ passivation, L is the distance from the point of zero-stress near the device middle to the anchor point 312, and t is the passivation film thickness. L, t and the direction of to are also indicated in FIG. 3.

Figure 2:
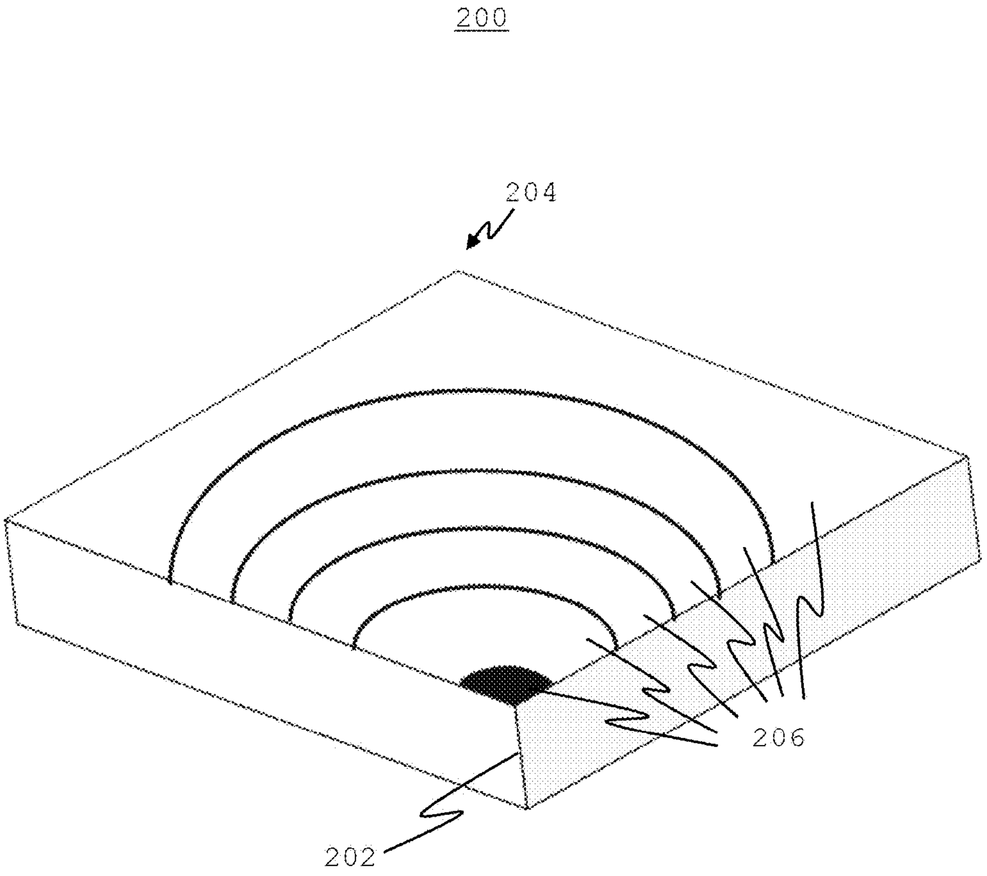
FIG. 2 is a 3-dimensional model of a quarter section of a semiconductor device, showing stress levels.

From equation 1 it follows that stress can exist at all points in the passivation membrane and reaches its peak at points furthest away from the point of zero-stress, i.e., at larger distances L. For the vast majority of power devices constructed in accordance with known good practice, the highest stress will manifest itself in device corners and along device edges, as also shown in FIG. 2.

Mechanical failure can occur once the accumulated (ratcheted) stress exceeds the yield strength at an interface, at which point the materials are no longer bonded to each other and hence one of the materials is left on its own to sustain the shear stress still acting on it from the other surrounding materials.

In the context of passivation cracks in the $SiN_x$ passivation layer, initially AlCu and $SiN_x$ work together to sustain the stress induced by the EMC. The initial carrying (ratcheting) is done by AlCu (due to its higher CTE) until it separates from the $SiN_x$ due to interface-bond fatigue between these two layers. At this point the $SiN_x$ is left alone to support the thermomechanical stress induced by the EMC.

Once on its own, the $SiN_x$ is said to be in its steady state and subsequent thermal cycles begin to wear out the mechanical integrity of the $SiN_x$, creating the first passivation cracks initiated at manufacturing imperfections, Si globules and local differences in residual bonding to AlCu.

For most power MOSFETs the ratio L/t in equation 1 is large, typically 1000-3000, which greatly amplifies the passivation layer stress at the edge 310 of metal, even for a modest value of to. By taking advantage of the ratcheting mechanism and decoupling the $SiN_x$ passivation from its anchor at the edge 310 of metal, it has been found that a virtually zero-stress edge can be achieved in the passivation, regardless of its structure and choice of materials.

Figure 4:
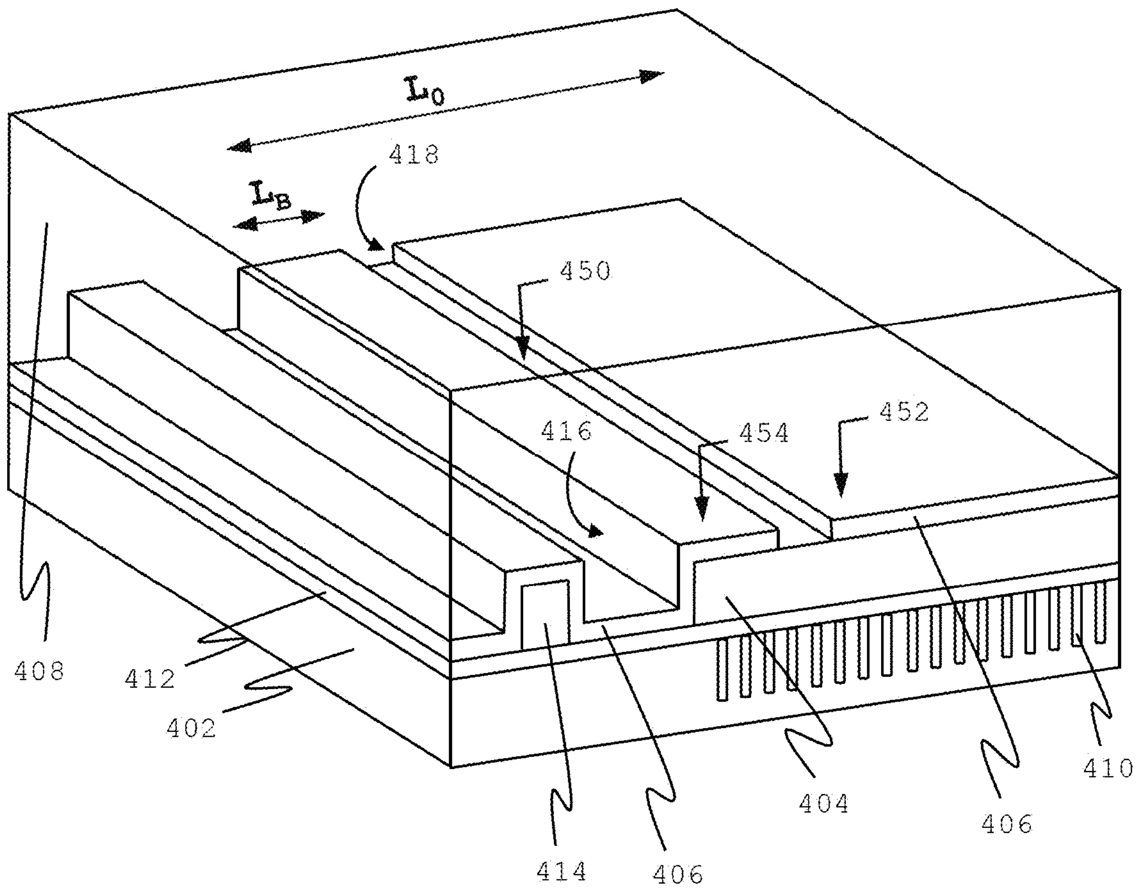
FIG. 4 shows a 3-dimensional schematic cross-section of a part of an example power MOSFET including a continuous passivation slot.

A virtually zero-stress solution of the present application is illustrated in the example embodiment of FIG. 4. FIG. 4 shows a schematic cross-section of a part of an example power MOSFET 400, oriented with a die edge towards the left and the die middle towards the right. Again, for explanatory purposes, the middle is presented here to be on the right side, making movements towards and from the middle linear from left to right. In reality, the middle will be at a center of the die, resulting in concentric forces and movements. A silicon layer 402, a metal layer 404, a passivation layer 406 and an EMC 408 are shown. Furthermore, trenches 410, an oxide layer 412 and a gate busbar 414 are shown.

The passivation layer 406 is shown to have multiple regions, in this example a first region A 452 and a second region B 454. A passivation slot 450 separates the first region A 452 from the second region B 454.

First region A 452 may be bonded to the EMC 408 and the metal 404, but otherwise not anchored to the edge 416 of any metal. The passivation slot 450 decouples the first region A 452 from its metal anchor at the edge 416. The first region A 452 may thus feature an edge 418 in the passivation layer 406 that naturally comes with zero stress, since the dimension 'L' in equation 1 for this region is zero due to the absence of an anchor. The first region A 452 may be referred to as a floating passivation.

The second region B 454 may be a part of the passivation layer 406 that is anchored to the edge 416 of metal 404 in the conventional way, but with a significantly (e.g., ~100×) reduced dimension 'L'. The second region B 454 may be referred to as an anchored passivation. In FIG. 4, $L_0$ depicts the distance L that would be applicable without the passivation slot 450 and $L_B$ depicts the distance L for the second region B 454. Introducing the passivation slot 450 thus results in $L_B \ll L_0$ and, following equation 1, a much lower tensile stress $\sigma_{SiNx}$ in the passivation layer in the second region B 454. Thus, by applying a passivation slot it may be avoided that cracks appear near the corners and edges of the die.

Preferably, $L_B$ is 10 to 10,000 times smaller than the original $L_0$, which in practice for most power MOSFETs means that $L_B$ may be less than 20 μm.

One or more stress-reducing passivation slots 450 may be created in strategic locations on the chip. The passivation slots 450 may fulfil a dual role: (i) provide a zero-stress edge that is robust against thermomechanical load from the EMC; and (ii) allow passivation cracks to be directed and contained in their fracture extent.

To create the one or more passivation slots 450, a new reticle design may be used. The redesigned reticle may be used at, e.g., contact bond, CB, or via, VI, photolithography for passivation patterning.

The redesigned passivation openings forming the passivation slots 450 may be classified into two broad categories: continuous slots and non-continuous slots.

Continuous slots may be used to provide (i) a continuous zero-stress edge and (ii) reduced tensile stress in the passivation at the edge of metal on the other side of the slot. The passivation slot 450 shown in FIG. 4 is an example of a continuous slot.

Figure 5:
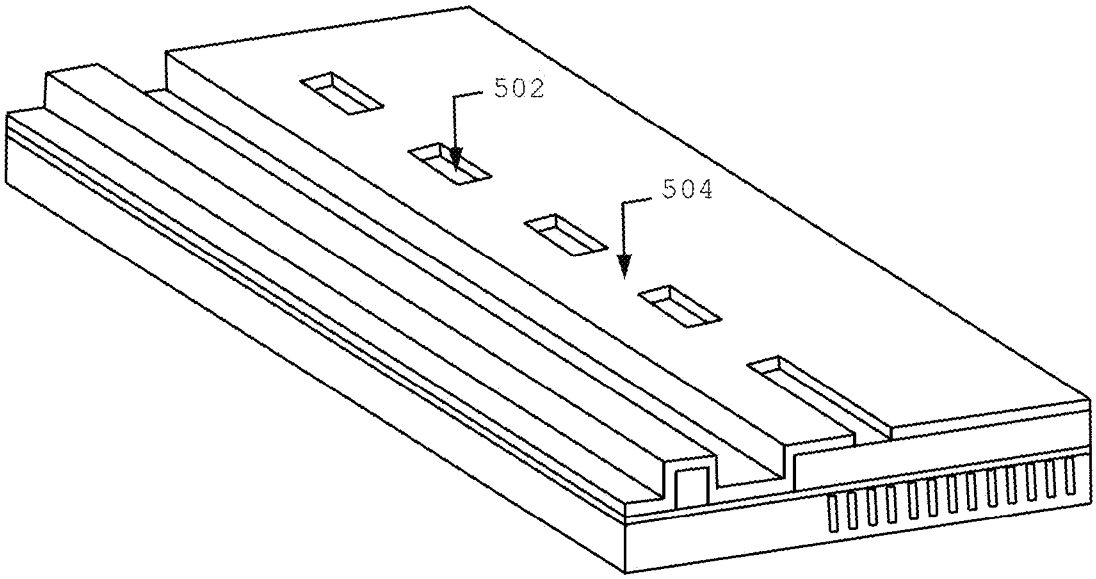
FIG. 5 shows a 3-dimensional schematic cross-section of a part of an example power MOSFET including a non-continuous passivation slot.

Alternatively, non-continuous slots (e.g., perforations) may be used to guide the passivation fracturing direction during thermomechanical load. This may be achieved by, e.g., having alternating regions, such as shown in FIG. 5, where the passivation is removed 502 and retained 504 in an alternating pattern. This may create high-stress regions, typically at or close to the retained regions 504, where passivation may fracture, next to low or zero-stress regions, i.e., the regions 502 where the passivation has been removed, where the fracturing terminates. The high stress-differential between these regions 502, 504 may result in effective guiding of the fracturing path.

Note that, besides the shape of the passivation slots, the example power MOSFETs 400 and 500 of FIGS. 4 and 5 include similar layers and features, which are not further identified in FIG. 5.

In FIGS. 4 and 5, the passivation slots are drawn having sharp or right-angled edges and corners. It will be understood that the edges and corners may be more rounded and/or irregular due to the manufacturing process.

Figure 6A:
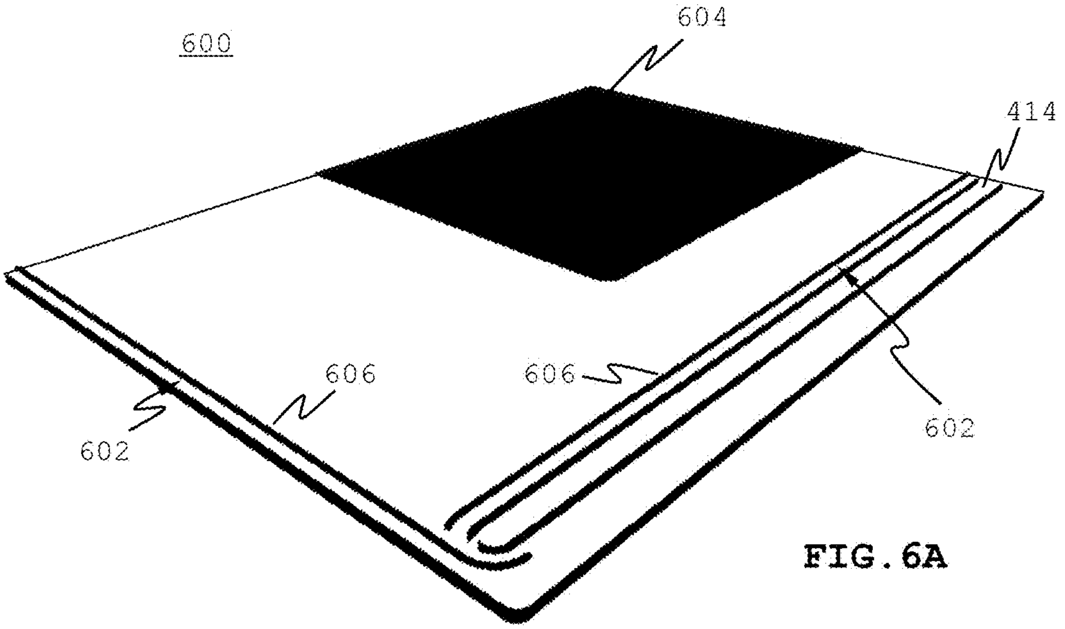
FIGS. 6A, 6B, 7A, 7B, 7C, 7D, 8, 9A, 9B and 9C show different variants of passivation slots.
Figure 6B:
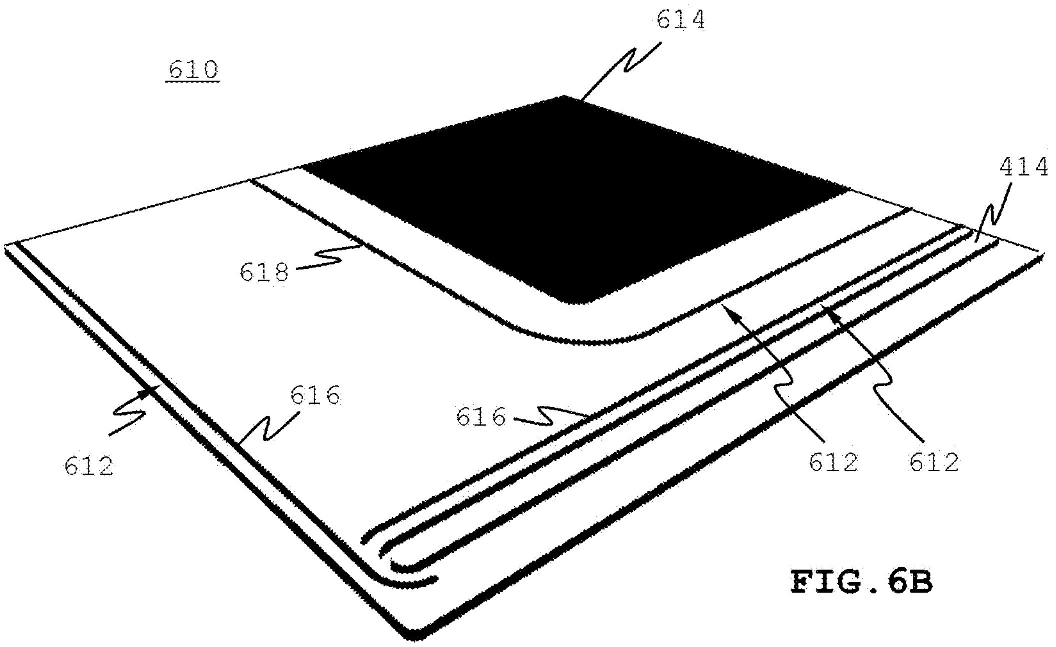

FIGS. 6A and 6B are example embodiments of passivation slots in the form of continuous passivation slots. Here, continuous is to be understood as having a substantial length. It is possible to form multiple continuous passivation slots, as shown in the examples of FIGS. 6A and 6B, where in the bottom corner the passivation slots 606, 616 are interrupted by, in these examples, a small portion without a slot. Such portion without a slot enables to define a controlled portion of the die where stress may be concentrated, and cracks may occur.

FIGS. 6A and 6B show a quarter of dies 600, 610. The die middle is depicted 604, 614 and die edges are depicted 602, 612.

In the example of FIG. 6A, continuous passivation slots 606 are created near the edges 602 of the die 600, typically close to edges 416 of a metal layer such as shown in FIG. 4. In the example of FIG. 6A one of the edges 602 is located near a gate busbar 414, similar to the example of FIG. 4. In FIG. 6A, arrow 602 points to one location, but it is to be understood that the edges 602 are typically present along the passivation slots 606. In this example, two passivation regions may be created: a first passivation region between the passivation slots 606 and the middle of the die with virtually no stress, and a second passivation region between the passivation slots 606 and the edges 602 of the die with limited amount of stress. The passivation slots 606 may be cut near the edge of metal to minimise dimension-L and contain the extent of any passivation cracks to the outer few μm near the edge of the metal. In this scheme, any cracks that arise may terminate on the outer edge of the slot.

In FIG. 6B, continuous passivation slots 616 are created near the edges 612, similar to the passivation slots 606 and edges 602 of FIG. 6A. Furthermore, in the example of FIG. 6B a further continuous passivation slot 618 is created closer to the middle 614 of the die 610, thereby creating a further passivation region. Such design may be advantageous when, e.g., multiple edges in underlying layers, such as the metal layer, are present, possibly resulting in multiple physical anchors on the passivation layer. It will be understood that the number of passivation slots 606, 616, 618 and the locations thereof may vary, depending on the design of the chip. Multi-ring passivation slots 616, 618 may thus be created at multiple locations where passivation stress may be disrupted/reset, allowing the passivation membrane to be carried more freely by the EMC and AlCu during thermo-mechanical loading.

FIGS. 7A-7D are example embodiments of passivation slots in the form of passivation perforations. Passivation perforations may have various shapes and sizes of perforation openings and provide stress-relieving openings either as a regular repeating pattern or a pattern that overlaps with another pattern to guide the direction of cracks and provide termination points.

FIGS. 7A-7D show a quarter of dies 700, 710, 720 and 730. The die middle is depicted 704, 714, 724, 734 and die edges are depicted 702, 712, 722, 732.

Figure 7A:
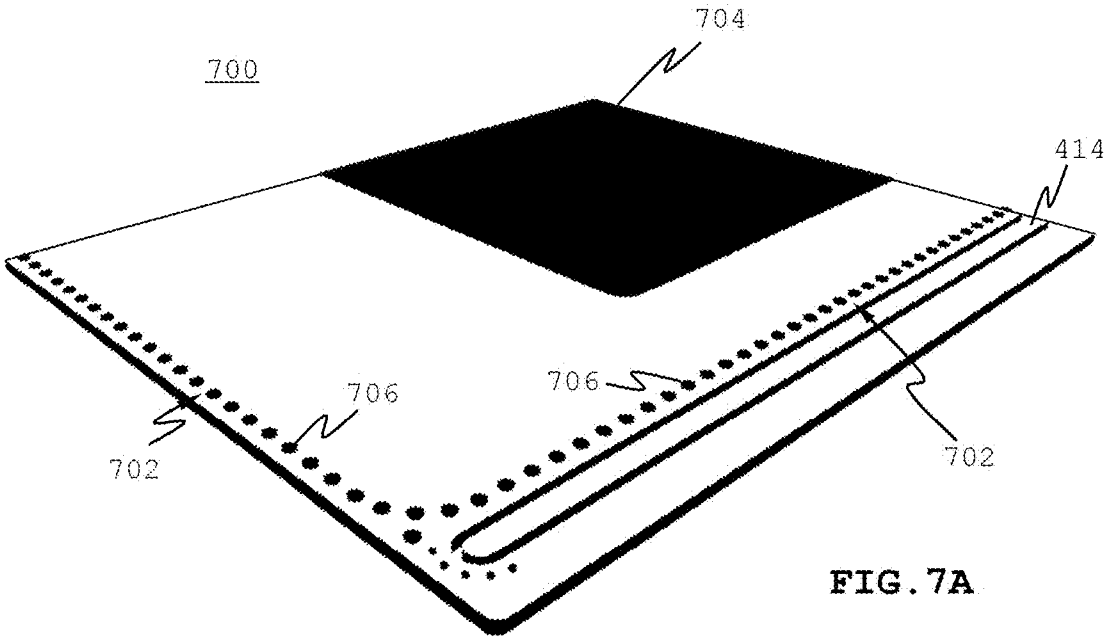
Figure 7B:
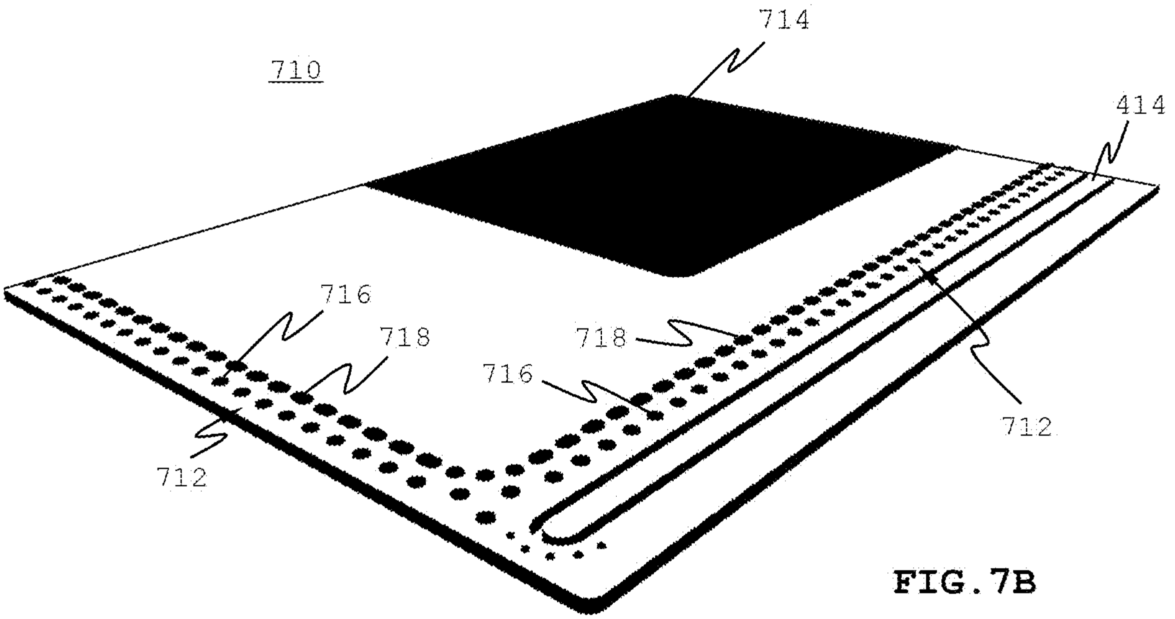
Figure 7C:
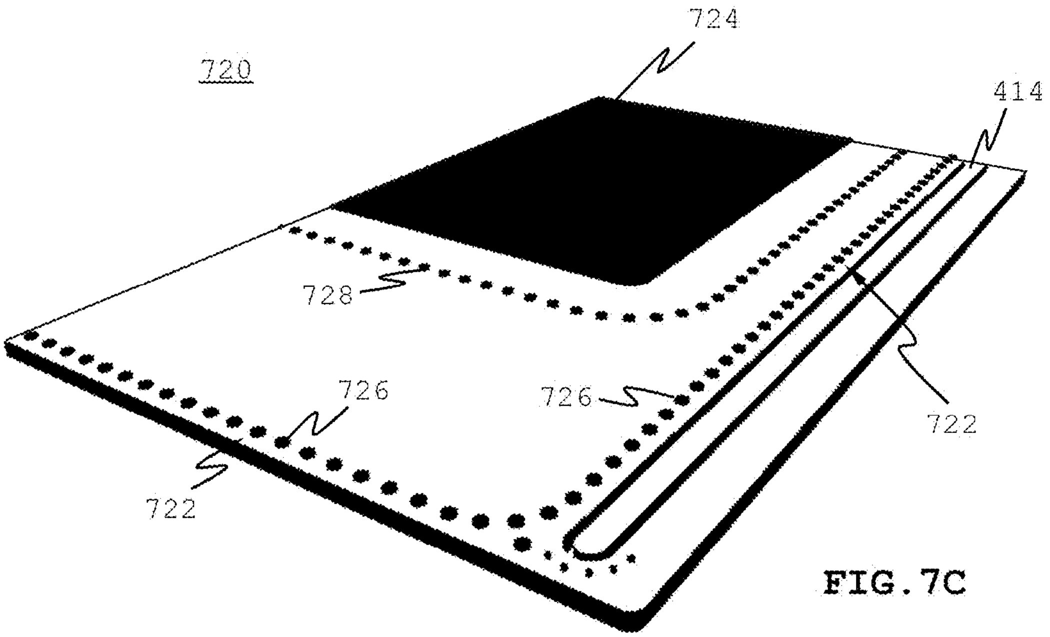
Figure 7D:
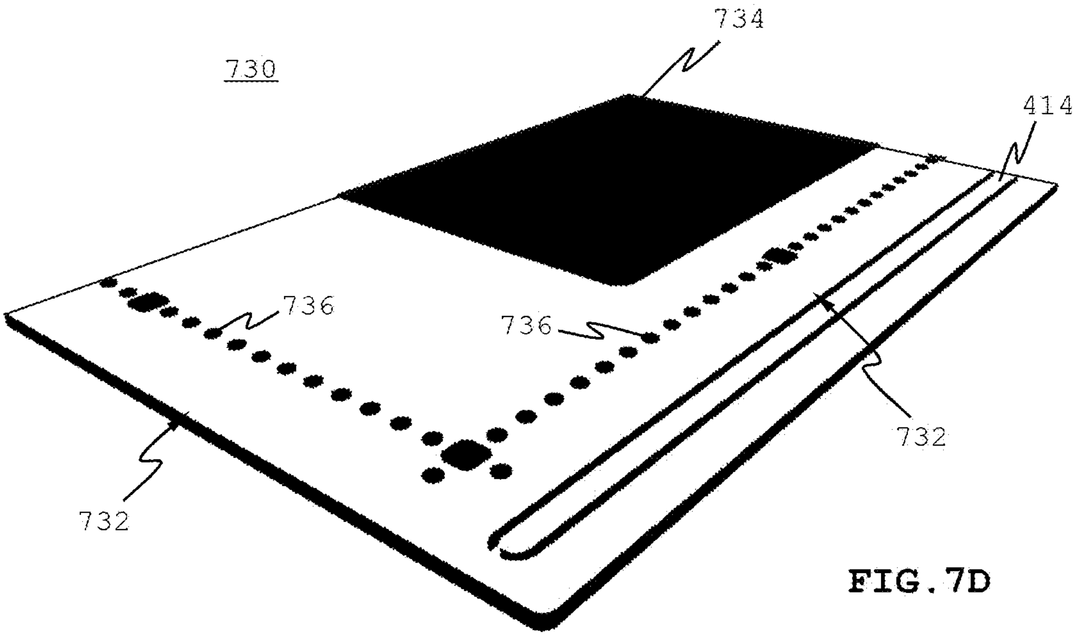

In the example of FIG. 7A, a regular repeating pattern of passivation slots 706 is applied near the edge 702 of the die 700. In the example of FIG. 7B, a regular repeating pattern of passivation slots 716 is applied near the edge 712 of the die 710, similar to the passivation slots 706 of FIG. 7A. In the example of FIG. 7B, a further regular repeating pattern of passivation slots 718 is applied closer to the middle 714 of the die 710. In the example of FIG. 7C, a regular repeating pattern of passivation slots 726 is applied near the edge 722 of the die 720, similar to the passivation slots 706 of FIG. 7A. In the example of FIG. 7C, a further regular repeating pattern of passivation slots 728 is applied even closer to the middle 724 of the die 720. In the example of FIG. 7D, an overlapping pattern of passivation slots 736 is applied to the die 730, with varying sizes of perforations. It will be understood that other patterns of perforations may be applied, depending on the chip design and desired stress reliefs.

The alternate perforations and regions of passivation, such as shown in the examples of FIGS. 7A-7D, may cause cracks to propagate between the perforations and be contained within the general vicinity of the perforations.

Figure 8:
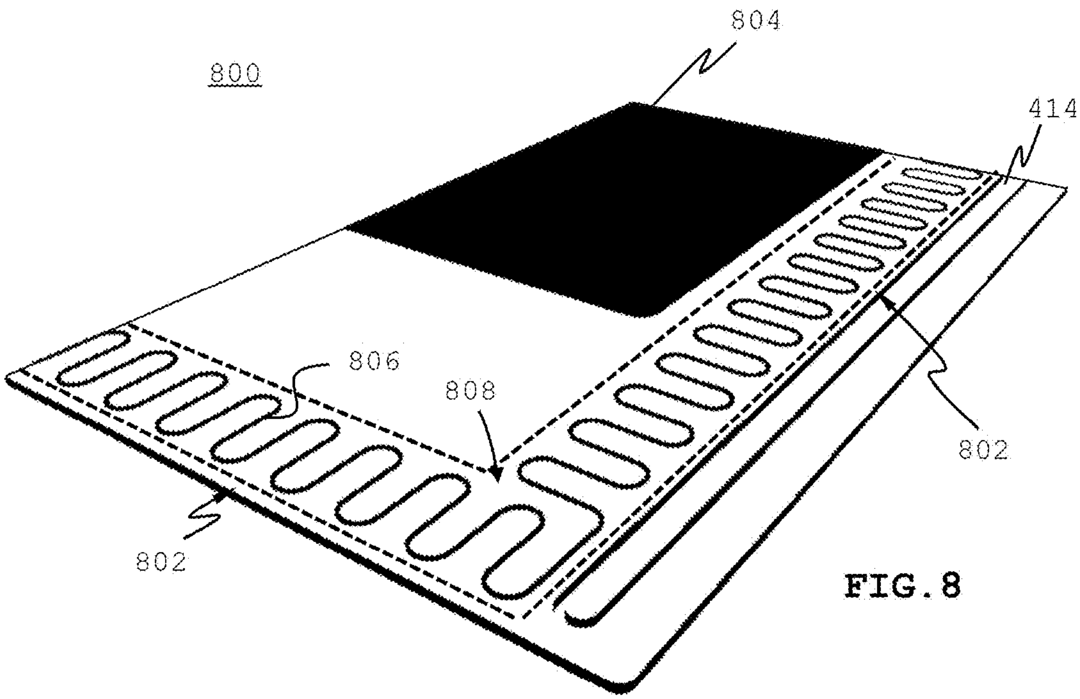

FIG. 8 is an example embodiment of a polygonal shaped passivation slot in the form of a serpentine passivation slot. Serpentine passivation slots may reduce the intrinsic material stiffness of the passivation layer in the vicinity of the slots, compared to the straight or perforation slots. Such smart patterning technique allows improved stress distribution, thereby enabling the layer to withstand higher stress generated during the thermal loading.

FIG. 8 shows a quarter of a die 800. The die middle is depicted 804 and die edges are depicted 802. In the example of FIG. 8, a serpentine passivation slot 806 is applied in a region 808 (region 808 is depicted as the dashed area) of enhanced mechanical deformation. The alternating long/short pattern of passivation width at the edge of metal as a result of the serpentine shape may reduce the chance of pattern shift behind the passivation slot 806.

Figure 9A:
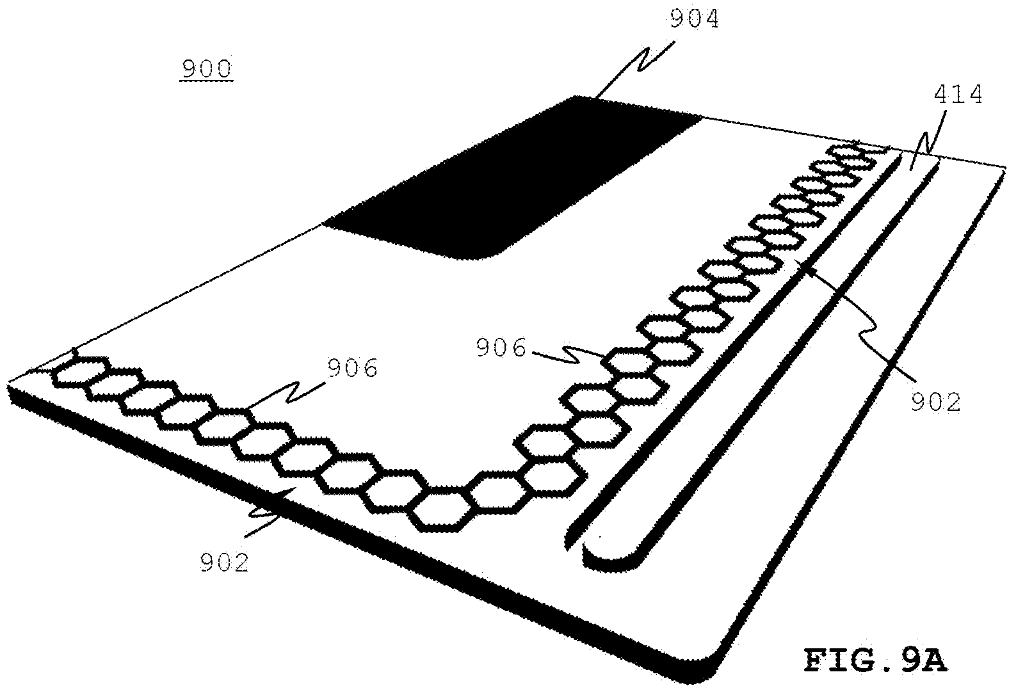
Figure 9B:
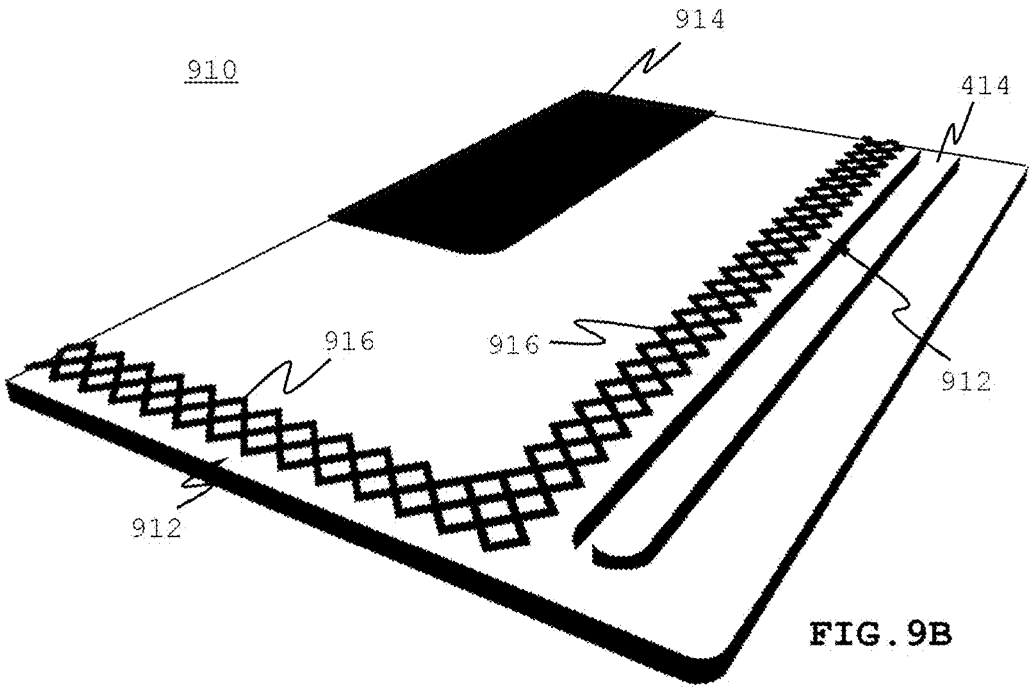
Figure 9C:
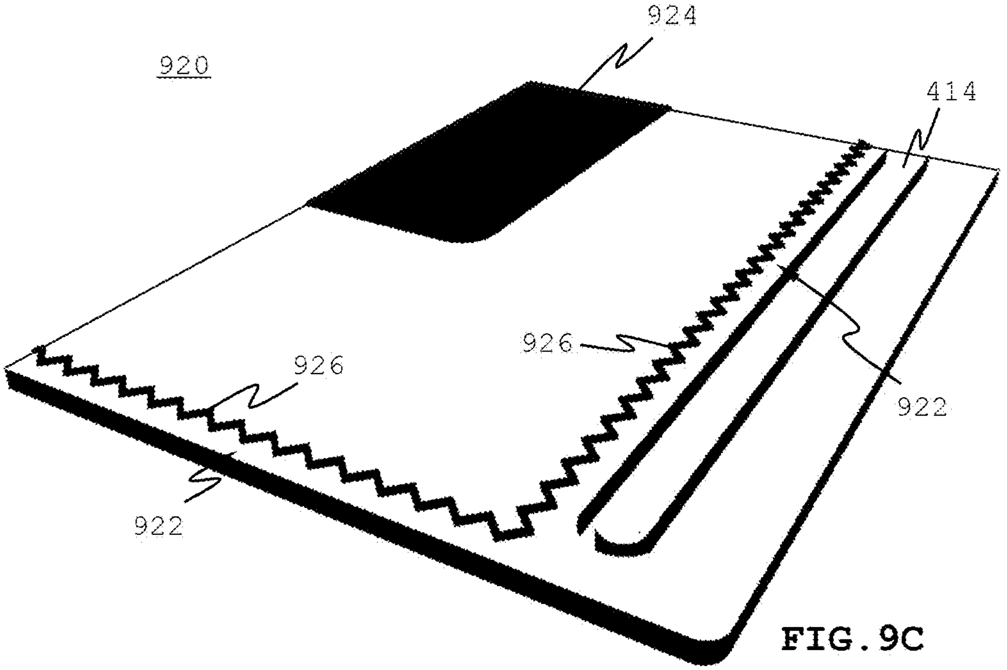

FIGS. 9A-9C are example embodiments of passivation slots having alternative polygonal forms with similar effects as the serpentine passivation slot 806.

FIGS. 9A-9C show a quarter of dies 900, 910, 920. The die middle is depicted 904, 914, 924 and die edges are depicted 902, 912, 922.

In the example of FIG. 9A, a honeycomb passivation slot 906 is applied. In the example of FIG. 9B, a criss-cross passivation slot 916 is applied. In the example of FIG. 9C, a zigzag passivation slot 926 is applied.

The polygonal shape of a passivation slot may vary, e.g., by varying pitch, length and/or angles. For example, a zigzag passivation slot, such as zigzag passivation slot 926, may have zigzags with angles between 10 degrees and 80 degrees. Preferably, all zigzags are formed using substantial the same angle, but different angles may be applied to one zigzag passivation slot. In an example embodiment, the zigzags may have an angle of 30 degrees. In another example embodiment, the zigzags may have an angle of 45 degrees. Similarly, corners in a polygonal passivation slot, such as honeycomb passivation slot 906, and corners in a criss-cross passivation slot, such as criss-cross passivation slot 916, may have angles between 5 degrees and 175 degrees. Preferably, honeycomb shapes within a honeycomb passivation slot are similarly shaped, but differently shaped honeycombs are possible. Preferably, criss-cross shapes within a criss-cross passivation slot are similarly shaped, but differently shaped criss-crosses are possible. Different serpentine passivation slots may have differently shaped serpentines. E.g., the dimensions of the serpentines forming the serpentine passivation slot may vary. Serpentines of one passivation slot are preferably substantially similarly shaped, but may be differently shaped.

In the example of FIG. 4, the passivation slot 450 is positioned such that there remains an anchor point near the edge 416 of the metal 404. Advantageously, as explained with FIG. 4, $L_B$ is much smaller than $L_0$, resulting in only a limited amount of stress in the second passivation region B 454. A further improvement may be realized by having the passivation slot coincide with the edge of the metal. An example hereof is shown in FIG. 10.

Figure 10:
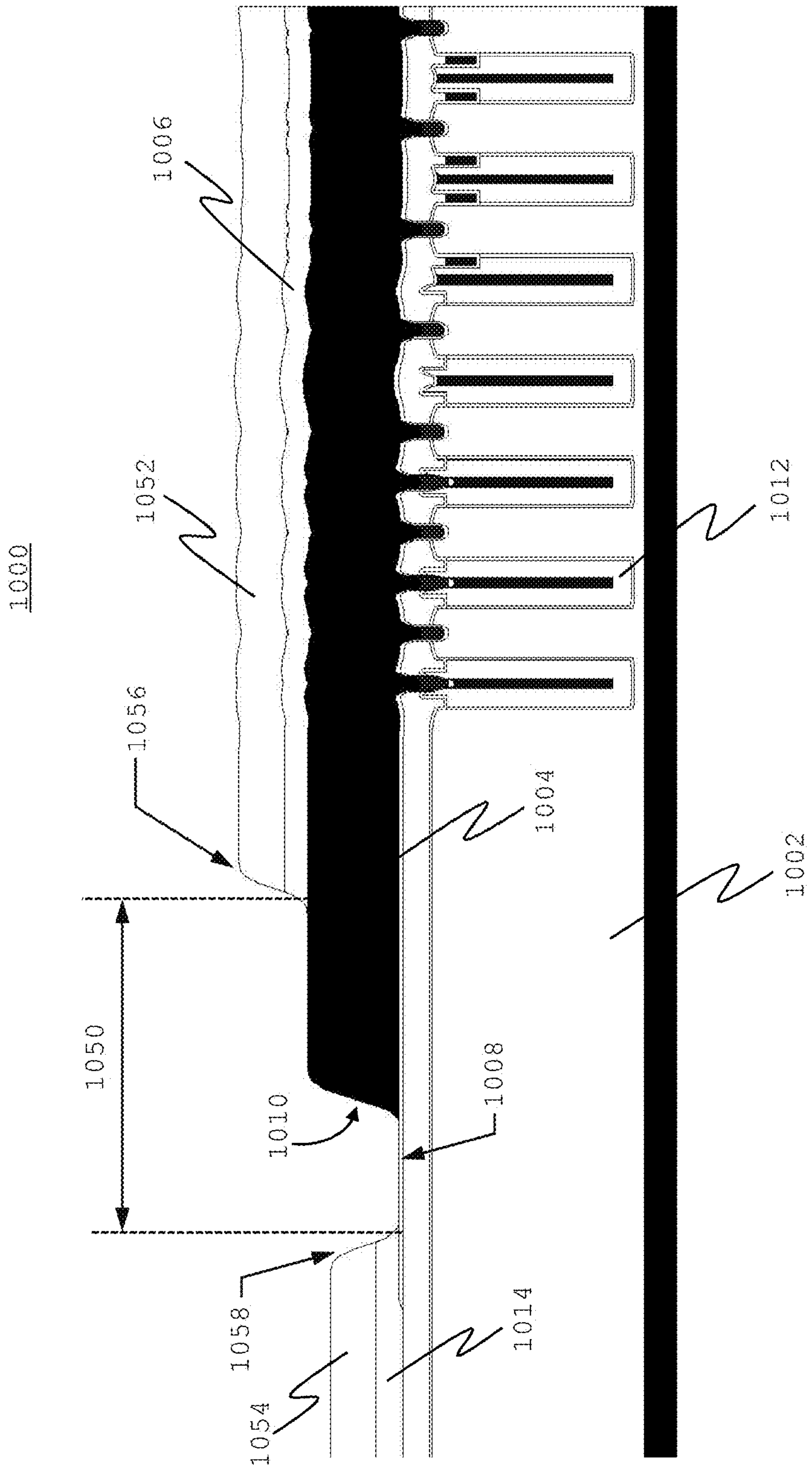
FIG. 10 shows a cross-section of a power MOSFET including a passivation slot.

FIG. 10 shows a 2-dimensional schematic cross-section of a part of an example power MOSFET 1000. An epitaxy layer 1002, an AlCu metal layer 1004, an oxide layer 1006, 1014, a Ti/TiN barrier layer 1008 and a passivation layer 1052, 1054, e.g., formed as a $SiN_x$ membrane, are shown. Furthermore, an edge 1010 of the metal layer 1004 and trenches 1012 are shown.

The passivation layer is shown to have multiple regions, in this example a first region 1052 and a second region 1054. A passivation slot 1050 separates the first region 1052 from the second region 1054. Moreover, the passivation slot 1050 is positioned on top of the edge 1010 of the metal 1004. In the example of FIG. 10, one edge 1056 of the passivation slot 1050 is placed over the metal 1004 while the other edge 1058 is placed off metal but still atop the Ti/TiN barrier foot 1008 to provide a convenient endpoint for, e.g., the VI-stage dry etch.

Besides the passivation layer, further layers may be separated by a passivation slot, such as passivation slot 1050. For example, as shown in FIG. 10, the passivation slot 1050 may separate the first region 1052 and oxide layer 1006, 1014 from the second region 1054 and a further layer 1014. Non-limiting examples of further layer 1014 are a further region of oxide layer and a further region of metal. Other layers may be separated by the passivation slot 1050 and the number of layers separated by the passivation slot 1050 may be different on each side of the passivation slot.

The passivation slot is typically formed in a single manufacturing step.

By decoupling the passivation 1052, 1054 from its anchor point (i.e., in the example of FIG. 10 there is no anchor point at the edge 1010 of metal 1004), the stress in the passivation layer may be reduced to its baseline value determined by the stress of deposition, because dimension L is zero at all points in the passivation layer $$(\sigma_{SiN} = \sigma_D + \frac{\tau_0 L}{t},$$

Figure 11:
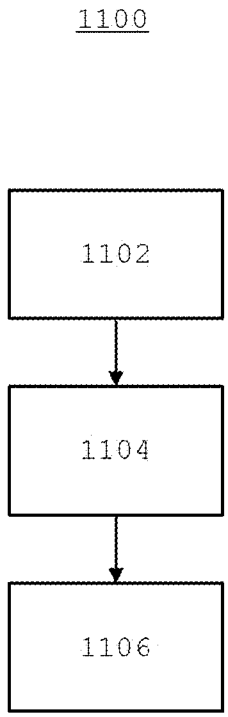
FIG. 11 shows steps of a method of producing a semiconductor device including a passivation slot.

Process steps for the manufacturing of a semiconductor device, such as a power MOSFET, are shown in the example embodiment of FIG. 11. Steps relevant to the present disclosure are shown, other steps may be applied as needed for forming other layers and features of the semiconductor device. In step 1102, a metal layer, such as metal 304, 404 or 1004, may be formed. The metal layer includes an edge, such as edge 310 or edge 1010, where the metal layer ends. In step 1104, a passivation layer, such as passivation layer 406, may be formed, such that it at least partly covers the metal layer. In step 1106, a passivation slot, e.g., such as shown in the above examples, may be formed in the passivation layer. The passivation slot is at least partially positioned over the metal layer and divides the passivation layer in multiple regions, such as regions 452 and 454 in FIG. 4 or regions 1052 and 1054 in FIG. 10. Each region experiences a reduced tensile stress $\sigma_{SiNx}$ as a result of the passivation slot.

To reduce stress and thereby reduce cracks in the passivation layer, other shapes of passivation slots may be applied, and different shapes of passivation slots may be mixed. The width and length of passivation slots may vary, depending on the design of the chip and the location of the passivation slot on the chip. In an example embodiment, a passivation slot may have a width of about 5 μm-20 μm.

The manufacturing processes for forming the various layers of the semiconductor device have not been detailed. Any known process may be used to form the various layers, and in particular to form the metal layer and the passivation layer.

As indicated above, to create the one or more passivation slots, e.g., CB or VI photolithography may be used for passivation patterning. With CB/VI photolithography, a photoresist layer may be deposited on the wafer, and a photomask may be used to expose the photoresist in the pattern of the one or more passivation slots. The exposed photoresist may be developed, and the passivation slots are etched into the wafer. A second layer of photoresist may then be deposited on top of the first layer, and a second photomask may be used to expose the areas where the passivation layer is to be removed. The exposed photoresist may be developed, and the passivation layer may be etched away in the exposed areas.

The passivation slots may be made during the same etch process that is used to make the main contact bond pads.

The present disclosure is not limited to the power MOSFET examples shown in the drawings. Moreover, the present disclosure is not limited to the specific layered construction of the semiconductor devices as shown in the drawings. It will be understood that the proposed passivation slots may be applied to other semiconductor devices and other layered constructions of semiconductor devices to achieve a reduction in tensile stress $\sigma_{SiNx}$.

Other features and advantages of the disclosure will be apparent from the description and the claims.

The invention claimed is:

1. A method of manufacturing a semiconductor device, the method comprising the steps of:

forming a metal layer above a silicon epitaxy layer of the semiconductor device, the metal layer including an edge where the metal layer ends;

forming a passivation layer at least partly covering the metal layer;

forming a passivation slot in the passivation layer, wherein the passivation slot is at least partially positioned over the metal layer; and wherein the passivation slot divides the passivation layer into multiple regions, wherein each region experiences a reduced tensile stress $\sigma_{SiNx}$ as a result of the passivation slot;

wherein the passivation slot is formed as a continuous passivation slot, wherein the passivation slot is polygonal shaped, wherein the passivation slot is formed as one type of slot selected from the group consisting of: a serpentine passivation slot, a honeycomb passivation slot, a criss-cross passivation slot, and a zigzag passivation slot.

2. The method according to claim 1, wherein the passivation slot is positioned over the metal layer to form a first region in the passivation layer and a second region in the passivation layer, wherein the first region does not have an anchor point with the edge of the metal layer, and wherein the second region has an anchor point with the edge of the metal layer.

3. The method according to claim 2, wherein the second region has an average width, $L_B$, measured from the passivation slot to the anchor point, wherein the anchor point is located at a distance $L_0$ from a middle of a die, and wherein $L_B$ is in a range of $L_0/10$ to $L_0/10000$.

4. The method according to claim 3, wherein the passivation slot follows the edge of the metal layer.

5. The method according to claim 3, further comprising: forming a portion in the passivation layer where no passivation slot is formed, wherein the portion is defined as a controlled fracturing zone configured to concentrate tensile stress in the passivation layer to the controlled-fracturing zone.

6. The method according to claim 2, wherein the passivation slot follows the edge of the metal layer.

7. The method according to claim 2, further comprising: forming a portion in the passivation layer where no passivation slot is formed, wherein the portion is defined as a controlled fracturing zone configured to concentrate tensile stress in the passivation layer to the controlled-fracturing zone.

8. The method according to claim 1, wherein the passivation slot is positioned over the edge of the metal layer to form a first region in the passivation layer and a second region in the passivation layer, and wherein the first region and the second region do not have an anchor point with the edge of the metal layer.

9. The method according to claim 8, wherein one edge of the passivation slot is placed over the metal layer while the other edge of the passivation slot is placed off the metal but still atop a barrier foot.

10. The method according to claim 8, wherein the passivation slot follows the edge of the metal layer.

11. The method according to claim 8, further comprising: forming a portion in the passivation layer where no passivation slot is formed, wherein the portion is defined as a controlled fracturing zone configured to concentrate tensile stress in the passivation layer to the controlled-fracturing zone.

12. The method according to claim 1, wherein the passivation slot is formed as a non-continuous passivation slot.

13. The method according to claim 12, wherein the passivation slot is formed as a series of perforations.

14. The method according to claim 1, wherein the passivation slot follows the edge of the metal layer.

15. The method according to claim 1, further comprising: forming a portion in the passivation layer where no passivation slot is formed, wherein the portion is defined as a controlled fracturing zone configured to concentrate tensile stress in the passivation layer to the controlled-fracturing zone.

16. The method according to claim 15, wherein the controlled-fracturing zone is formed between passivation slots.

17. A semiconductor device comprising:
a metal layer formed above a silicon epitaxy layer of the semiconductor device, the metal layer including an edge where the metal layer ends;
a passivation layer at least partly covering the metal layer and a passivation slot in the passivation layer;
wherein the passivation slot is at least partially positioned over the metal layer; and
wherein the passivation slot is configured to divide the passivation layer into multiple regions, wherein each region experiences a reduced tensile stress $\sigma_{SiNx}$ as a result of the passivation slot;
wherein the passivation slot is a continuous passivation slot,
wherein the passivation slot is polygonal shaped,
wherein the passivation slot is selected from one type of slot selected from the group consisting of: a serpentine passivation slot, a honeycomb passivation slot, a criss-cross passivation slot, and a zigzag passivation slot.

18. The semiconductor device according to claim 17, wherein the semiconductor device is a power MOSFET.

* * * * *